(12) United States Patent
Franceschini et al.

(10) Patent No.: US 8,341,501 B2
(45) Date of Patent: Dec. 25, 2012

(54) ADAPTIVE ENDURANCE CODING OF NON-VOLATILE MEMORIES

(75) Inventors: Michele M. Franceschini, Yorktown Heights, NY (US); Ashish Jagmohan, Yorktown Heights, NY (US); John P. Karidis, Yorktown Heights, NY (US); Luis A. Lastras-Montano, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 909 days.

(21) Appl. No.: 12/433,669

(22) Filed: Apr. 30, 2009

(65) Prior Publication Data
US 2010/0281340 A1    Nov. 4, 2010

(51) Int. Cl.
*H03M 13/00* (2006.01)
*G11C 29/00* (2006.01)

(52) U.S. Cl. ......... 714/774; 714/767; 714/718; 711/103
(58) Field of Classification Search .................. 714/718, 714/767, 768, 774; 711/103
See application file for complete search history.

(56) References Cited

U.S. PATENT DOCUMENTS

| | | | |
|---|---|---|---|
| 6,157,570 A | 12/2000 | Nachumovsky | |
| 6,449,116 B2 * | 9/2002 | Morris et al. | 360/77.04 |
| 6,532,121 B1 * | 3/2003 | Rust et al. | 360/8 |
| 6,640,319 B1 | 10/2003 | Weng | |
| 6,725,321 B1 | 4/2004 | Sinclair et al. | |
| 6,788,612 B2 | 9/2004 | Hsu et al. | |
| 6,794,997 B2 | 9/2004 | Sprouse | |
| 6,903,981 B2 | 6/2005 | Futatsuyama et al. | |
| 6,961,890 B2 | 11/2005 | Smith | |
| 6,978,342 B1 | 12/2005 | Estakhri et al. | |
| 7,039,788 B1 | 5/2006 | Change et al. | |
| 7,080,192 B1 | 7/2006 | Wong | |
| 7,245,556 B1 | 7/2007 | Pinto et al. | |
| 7,315,870 B2 | 1/2008 | Mukaida | |
| 7,340,581 B2 | 3/2008 | Gorobets et al. | |
| 7,382,660 B2 | 6/2008 | Bovino et al. | |
| 7,409,489 B2 | 8/2008 | Sinclair | |
| 7,409,524 B2 | 8/2008 | Safford et al. | |
| 7,441,090 B2 | 10/2008 | Estakhri et al. | |
| 7,450,420 B2 | 11/2008 | Sinclair et al. | |
| 7,457,909 B2 | 11/2008 | Di Sena et al. | |
| 7,493,442 B2 | 2/2009 | Wong et al. | |
| 7,511,646 B2 | 3/2009 | Cornwell | |
| 7,516,371 B2 | 4/2009 | Sakaue et al. | |

(Continued)

OTHER PUBLICATIONS

Huang, W.T.; Chen, C.T.; Chen, C.H.; , "The Real-Time Compression Layer for Flash Memory in Mobile Multimedia Devices," Multimedia and Ubiquitous Engineering, 2007, MUE '07. International Conference on, vol., No., pp. 171-176, Apr. 26-28, 2007.*

(Continued)

*Primary Examiner* — Cynthia Britt
(74) *Attorney, Agent, or Firm* — Cantor Colburn LLP; Brian Verminski

(57) ABSTRACT

Adaptive endurance coding including a method for storing data that includes receiving write data and a write address. A compression algorithm is applied to the write data to generate compressed data. An endurance code is applied to the compressed data to generate a codeword. The endurance code is selected and applied in response to the amount of space saved by applying the compression to the write data. The codeword is written to the write address.

13 Claims, 11 Drawing Sheets

U.S. PATENT DOCUMENTS

| | | | |
|---|---|---|---|
| 7,529,881 | B2 | 5/2009 | Pascucci et al. |
| 7,539,077 | B2 | 5/2009 | Yoon et al. |
| 7,697,325 | B2 | 4/2010 | Sprouse et al. |
| 7,877,564 | B2 | 1/2011 | Eldredge et al. |
| 8,050,086 | B2 | 11/2011 | Shalvi et al. |
| 8,176,234 | B2 * | 5/2012 | Franceschini et al. ......... 711/103 |
| 2003/0037215 | A1 | 2/2003 | Chen |
| 2004/0160343 | A1 | 8/2004 | Sprouse |
| 2006/0282610 | A1 | 12/2006 | Dariel et al. |
| 2007/0033375 | A1 | 2/2007 | Sinclair et al. |
| 2007/0147168 | A1 | 6/2007 | Pinto et al. |
| 2007/0150644 | A1 | 6/2007 | Pinto et al. |
| 2007/0168632 | A1 | 7/2007 | Zeevi et al. |
| 2007/0171714 | A1 | 7/2007 | Wu et al. |
| 2007/0233939 | A1 | 10/2007 | Kim |
| 2007/0233941 | A1 | 10/2007 | Lee et al. |
| 2007/0233989 | A1 | 10/2007 | Kim |
| 2008/0256352 | A1 | 10/2008 | Chow et al. |
| 2009/0027652 | A1 | 1/2009 | Chang et al. |
| 2009/0055605 | A1 | 2/2009 | Wu et al. |
| 2009/0080249 | A1 | 3/2009 | Sprouse et al. |
| 2009/0125671 | A1 | 5/2009 | Flynn et al. |
| 2009/0150595 | A1 | 6/2009 | Lavan |
| 2009/0150600 | A1 | 6/2009 | Suda |
| 2009/0327590 | A1 | 12/2009 | Moshayedi |
| 2009/0327591 | A1 | 12/2009 | Moshayedi |
| 2010/0088464 | A1 * | 4/2010 | Yang ............................. 711/103 |
| 2010/0158043 | A1 | 6/2010 | Bodo et al. |
| 2011/0138104 | A1 | 6/2011 | Franceschini et al. |
| 2011/0138105 | A1 | 6/2011 | Franceschini et al. |
| 2012/0096328 | A1 * | 4/2012 | Franceschini et al. ......... 714/758 |

OTHER PUBLICATIONS

Wen-Tzeng Huang; Chun-Ta Chen; Yen-Sheng Chen; Chin-Hsing Chen; , "A compression layer for NAND type flash memory systems," Information Technology and Applications, 2005. ICITA 2005. Third International Conference on, vol. 1, No., pp. 599-609, Jul. 4-7, 2005.*

Suyoun Lee; Jeung-hyun Jeong; Taek Sung Lee; Won Mok Kim; Byung-ki Cheong; , "A Novel Programming Method to Refresh a Long-Cycled Phase Change Memory Cell," Non-Volatile Semiconductor Memory Workshop, 2008 and 2008 International Conference on Memory Technology and Design. NVSMW/ICMTD 2008. Joint, vol., No., pp. 46-48, May 18-22, 2008.*

Ashish Jagmohan et al.; "Write Amplification Reduction in Nand Flash through Multi-Write Coding"; storageconference.org/2010/Presentations/Research/S10.Jagmohan.pdf; Jun. 2010.

"Improving the endurance characteristics through boron implant at active edge in 1 G NAND Flash"; IEEE, 15-19, Apr. 2007; pp. 652-653.

"Design of on-chip error correction systems for multilevel nor and Nand flash memories"; F. Sun et al.; IET Circuit Devices Syst., 2007, 1, (3); pp. 241-249.

Fang-Weig Fu et al.; "On the Capacity of Generalized Write-Once Memory with State Transitions Described by an Arbitrary Directed Acyclic Graph"; IEEE Transactions of Information Theory; vol. 45; No. 1; Jan. 1999; pp. 308-313.

U.S. Appl. No. 12/631,470, filed Dec. 4, 2009 "Method and System for Multi-wire Coding for NAND Flash Device".

U.S. Appl. No. 12/631,505, filed Dec. 4, 2009; "NAND Flash System with Enhanced Write Performance and Endurance".

U.S. Appl. No. 12/903,695, filed Oct. 13, 2010; "Multi-Write Endurance and Error Control Codingof Non-Volatile Memories".

Michele M. Franceschini et al.;U.S. Appl. No. 12/903,695, filed Oct. 13, 2010; "Multi-Write Endurance and Error Control Coding of Non-Volatile Memories".

A. Ben-Aroya; "Competitive Analysis of Flash-Memory Algorithms"; Lecture Notes in Computer Science 4168 (2006) pp. 1-59.

A. Fiat et al; Generalized "Write-Once" Memories; IEEE Transactions on Information Theory; vol., IT-30, No. 3, May 1984; pp. 470-480.

A. Jiang; On the Generalization of Error-Correcting WOM Codes; in IEEE International Symposium on Information Theory; ISIT 2007, pp. 1391-1395.

A. Jiang et al.; "Floating Codes for Joint Information Storage in Write Asymmetric Memories"; in IEEE International Symposium on Information Theory, ISIT 2007; pp. 1166-1170.

A. Kawaguchi et al.; "A Flash memory Based File System"; pp. 1-10.

C. Heegard; "On the Capacity of Permanent Memory"; IEEE Transactions on Information Theory; vol. IT-31; No. 1; Jan. 1985; pp. 34-42.

C. Heegard; Partitioned Linear Block Codes for Computer Memory with "Stuck-at" Defects; IEEE Transactions on Information Theory; vol. IT-29; No. 6; Nov. 1983; pp. 831-842.

C. Heegard et al.; "On the Capacity of Computer Memory with Defects"; IEEE Transactions on Informaiton Theory, vol. IT-29, No. 5, Sep. 1983; pp. 731-739.

D. Dolev et al.; "Correcting Faults in Write Once Memory"; 1984 ACM 0-89791-133-4/84/004/0225; pp. 225-229.

D. Woodhouse; "JFFS: The Journaling Flash File System"; in Ottawa Linux Symposium; pp. 1-12.

E. Yaakobi et al.; "Error Correction Coding for Flash Memories"; Flash Memory Summit, Aug. 2009; pp. 1-17.

E. Yaakobi et al.; "Multidimensional Flash Codes"; arXiv.0901.0702v3 [cs.It]; Apr. 3, 2009; pp. 1-8.

Eran Gal et al.; "Algorithms and Data Structures for Flash Memories"; ACM Computing Surveys 37, No. 2, (2005); pp. 138-163.

F. Merkx; 09-Womcodes Constructed With Projective Geometries; Traitement du Signal; vol. 1, No. 2-2 (1984); pp. 227-231.

Fang-Wei Fu et al.; "On the Capacity and Error-Correcting Codes of Write-Efficient Memories"; IEEE Transactions on Information Theory; vol. 46; No. 7; Nov. 2000; pp. 2299-2314.

Fang-Wei Fun et al.; "On the Capacity of Generalized Write-Once Memory with State Transitions Described by an Arbitrary Directed Acyclic Graph"; IEEE Transactions of Information Theory; vol. 45; No. 1; Jan. 1999; pp. 308-313.

G. Cohen et al.; "Linear Binary Code for Write Once Memories"; IEEE Transactions on Information Theory; vol. IT-32; No. 5; Sep. 1986; pp. 697-700.

H. Finucane et al.; "Designing Floating Codes for Expected Performance"; in Communication, Control and Computing; 2008, 46th Annual Allerton Conference on 2008; pp. 1389-1396.

H. Finucane et al.; "Worst-Case and Average-Case Floating Codes for Flash Memory"; Computer Science Group; Harvard University; TR-04-09; pp. 1-43.

Hu et al.; "Write Amplification Analysis in Flash-Based Solid State Drives"; SYSTOR 2009; pp. 1-13.

J. Fridich et al.; "Steganography via Codes for Memory with Defective Cells"; in 43rd Conference on Coding; Communication and Control 2005; pp. 1-17.

J. Martin Borden et al.; On-Coding for "Stuck-At" Defects; IEEE Transactions on Information Theory; vol. IT-33; No. 5; Sep. 1987; pp. 729-735.

Jai Menon et al.; "An Age Threshold Algorithm for Garbage Collection in Log-Structured Arrays and File Systems"; (Citeseer, 1998); pp. 1-15.

Li-Pin Chang et al.; Real-Time Garbage Collection for Flash-Memory Storage Systems of Real-Time Embedded Systems; ACM Transactions on Embedded Computing Systems; vol. 3, No. 4, Nov. 2004; pp. 837-863.

M. Mitzenmacher et al.; "The Power of Two Random Choices: A Survey of Techniques and Results"; pp. 1-60.

Mandavifar et al; "A Nearly Optimal Construction of Flash Codes"; arXiv:0905.1512v1 [cs.IT]; May 10, 2009; pp. 1-5.

R. Krishnamoorthy et al.; "Error Control to Increase the Yield of Semiconductor RAM's"; in Information Theory Workshop at Cornell; The 1989 IEEE/CAM, 1989, 7-3; 1 page.

R. Rivest et al.; How to Reuse a "Write Once" Memory; Reprinted from Information; vol. 55; Nos. 1-3; Oct./Nov./Dec. 1982 Printed in Belgium; pp. 1-19.

Ivaniuk et al, Detecting Multiple Errors in Ram by Self-Adjusting Output Data Compression,ISSN 1063-7397, Russian Microelectronics, 2007, vol. 36, No. 4, pp. 271-277.

Godard et al., Evaluation of Design for Reliability Techniques in Embedded Flash Memories,2007, pp. 6.

Ben-Aroya et al., Competitive Analysis of Flash-Memory Algorithms, ESA 2006, LNCS4168, pp. 100-111.

IBM, Adding and Wear-Leveling (and Potentially Atomic Journaling) Support for Metadata on FAT12/FAT16/FAT32 file system, targetting flash memory storage devices. IBM Technical Disclosure, Oct. 7, 2008.

* cited by examiner

```
      Sort possible information sequences      ⌐ 1102
       from most probable to least probable

↓

Sort possible written codewords          ⌐ 1104
        from least costly to most costly

↓

Build an encoding table associating       ⌐ 1106
         the elements of the information
      sequence list with the codeword list
```

FIG. 11

|     |   |       | K=2 | K=3 |
|-----|---|-------|-----|-----|
| 00  | a | 0.5   | 11  | 111 |
| 01  | b | 0.25  | 01  | 011 |
| 10  | c | 0.125 | 10  | 101 |
| 11  | d | 0.125 | 00  | 110 |

Message (data sequence) ↗ (points to first column)
Message probability ↗ (points to third column)
Codes ↗ (points to K=2 and K=3 columns)

FIG. 12

ADAPTIVE ENDURANCE CODING OF NON-VOLATILE MEMORIES

BACKGROUND

This invention relates generally to computer memory, and more specifically to adaptive endurance coding of non-volatile memories.

Phase-change memories (PCMs) and flash memories are examples of non-volatile memories with limited endurance (also referred to as a "limited life"). Such memories have limited endurance in the sense that after undergoing a number of writing cycles (RESET cycles for PCM, program/erase cycles for flash memory), the memory cells wear out and can no longer reliably store information.

A technique called endurance coding, where patterns are written to memory such that cell wear is reduced, may be utilized to lengthen the life of limited life memories. A shortcoming of current endurance coding schemes is that they induce an expansion of the data and do not feature any mechanism to adapt the parameters of endurance coding to the data compressibility and to the memory page length. This implies that either a different page length has to be used for each data word, or endurance increase has to be sacrificed.

Other related implementations include methods for writing on write-once and write-efficient memories, which allow an increased amount of data to be stored per memory write and/or over the lifetime of the memory. Again, a shortcoming of these methods is that they do not allow endurance codes to be adaptively selected for different data.

SUMMARY

An exemplary embodiment is a method for storing data that includes receiving write data and a write address. A compression algorithm is applied to the write data to generate compressed data. An endurance code is applied to the compressed data to generate a codeword. The endurance code is selected and applied in response to the amount of space saved by applying the compression to the write data. The codeword is written to the write address.

Another embodiment is a system including a receiver receiving write data and a write address. The system also includes a data compressor applying a compression algorithm to the write data to generate compressed data. The system further includes an endurance coder applying an endurance code to the compressed data, where the endurance code is selected and applied in response to the amount of space saved by applying the compression to the write data. Output from the endurance coder is a codeword. The system further includes a memory writer writing the codeword to the write address.

An additional exemplary embodiment is a method for accessing memory including retrieving a codeword from a memory address. The codeword is multiplied by a metadata matrix to recover metadata for the codeword. The metadata includes a data location specification. Data is identified in the codeword in response to the metadata, and the data is output as read data.

A further exemplary is a system that includes a memory reader retrieving a codeword from a memory address. The system also includes a metadata computer multiplying the codeword by a metadata matrix to recover metadata for the codeword, where the metadata includes a data location specification. The system further includes a metadata interpreter identifying data in the codeword in response to the metadata, and a transmitter outputting the data as read data.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 11 illustrates a process for performing joint compression and expansion that may be implemented by an exemplary embodiment; and FIG. 12 illustrates joint compression and endurance coding that may be implemented by an exemplary embodiment.

DETAILED DESCRIPTION

An exemplary embodiment of the present invention includes an adaptive endurance coding system and method for limited life memories, where data to be written into memory is converted into a form that causes reduced wear to the memory cells, and thus prolongs memory life. In an exemplary embodiment, the data written is resilient to errors (i.e. data can be recovered even in the presence of errors in the stored information after storage).

An exemplary embodiment includes a system and method for writing data with enhanced endurance onto a non-volatile memory device. Lossless data compression is utilized in conjunction with endurance coding and error resilience, in a manner that adapts the endurance coding parameters to the properties of the data and to memory parameters such as memory page size. Thus, if the data to be written is very compressible, a high endurance gain can be achieved. Alternately, if the data is not very compressible, the endurance code is selected so as to ensure that the coded data will fit into the memory page. Thus, an exemplary embodiment allows attainment of a maximum benefit of endurance coding, while ensuring that the generated data will always fit inside a given memory page. This considerably simplifies memory bookkeeping, and thus, improves memory access performance. Further, an exemplary embodiment incorporates error-resilience in a manner that preserves the endurance gain, while ensuring that data can be correctly recovered from memory.

Figure 1:
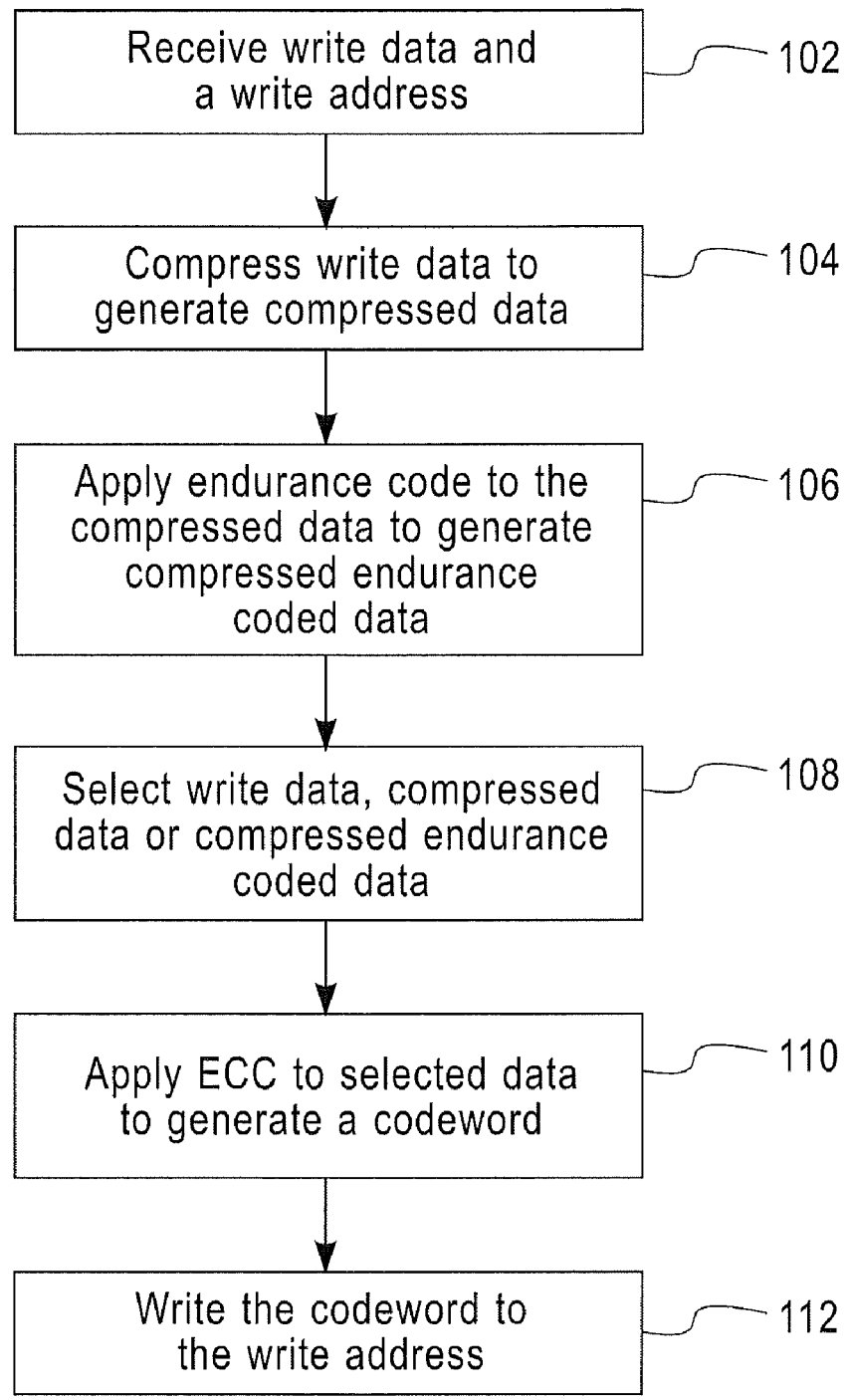
FIG. 1 illustrates a process for writing data that may be implemented by an exemplary embodiment.

FIG. 1 illustrates a process for writing data using adaptive endurance coding that may be implemented by an exemplary embodiment. At block 102, write data and a write address are received (e.g., at a memory controller). In an exemplary embodiment, the write address is a page address and the write data is a page of data (e.g., 4K bits). At block 104, the write data is compressed to generate compressed data. An endurance code is then applied to the compressed data at block 106 to generate compressed endurance coded data. The endurance code applied is selected based on characteristics of the compressed data and the target memory device(s). One of the write data, the compressed data, and the compressed endurance coded data is selected at block 108 and at block 110 the selected data is ECC encoded to generate a codeword. At block 112, the codeword is written to the memory at the write address.

Figure 2:
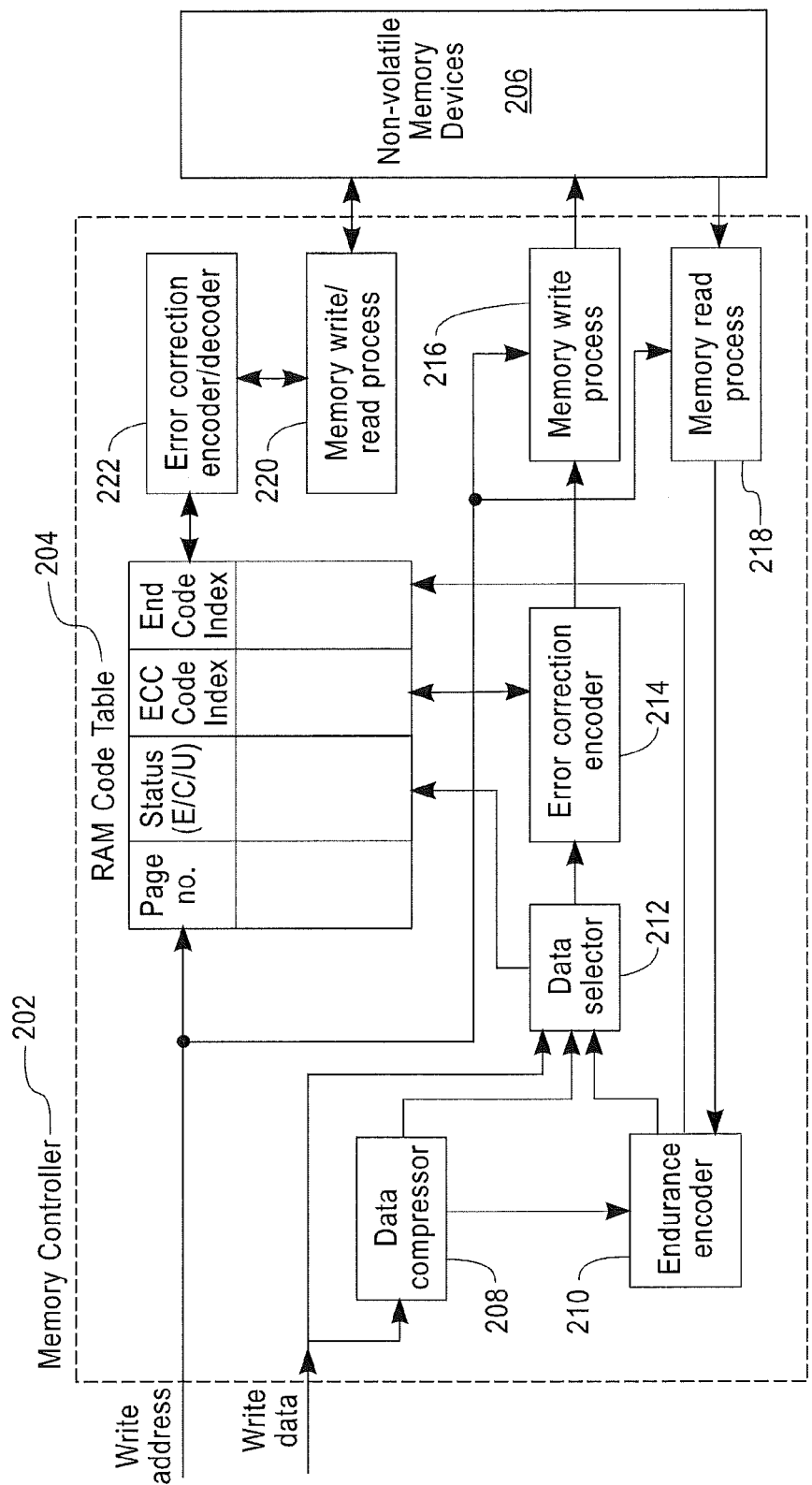
FIG. 2 illustrates a block diagram of a memory controller for writing data that may be implemented by an exemplary embodiment.

FIG. 2 illustrates a block diagram of a memory controller for writing data that may be implemented by an exemplary embodiment. The memory controller 202 depicted in FIG. 2 combines data compression and endurance coding in order to write to a non-volatile memory in a manner that enhances memory endurance. The exemplary memory controller 202 depicted in FIG. 2 includes a code table in random access memory (RAM), referred to herein as the RAM code table 204, which stores endurance code/compression status information for each unit of data stored in a non-volatile memory 206 (e.g., on a memory device). The status information in the exemplary RAM code table 204 depicted in FIG. 2 includes: (1) an indication of whether the page status is un-coded ("U"), compressed ("C"), or compressed and endurance coded ("E"); (2) an ECC code index which indicates which of the available set of error-correction codes has been used to code the current page data; and (3) an endurance code index which indicates which, if any, endurance code has been used to code the page data. The information stored in the RAM code table 204 is referred to herein as "metadata."

Inputs to the memory controller 202 depicted in FIG. 2 include the address of the page to be written, and the data to be written to the page. In an exemplary embodiment, the inputs are received via a receiver located on the memory controller 202 (or other location). The receiver may be implemented in a variety of manners including hardware for receiving the inputs and/or a storage location (e.g., a register) where the inputs are located. The page address is used to index the RAM code table 204 in order to retrieve the endurance coding status information. The page data (also referred to herein as write data) is input to the data compressor 208, which applies a lossless data compression algorithm to compress the write data. Examples of lossless data compression algorithms that may be implemented include, but are not limited to: arithmetic coding, Huffman coding, Lempel-Ziv coding, and BWT coding. In addition, if characteristics (such as statistics) of the write data are known a-priori or are predictable, any specialized lossless coding algorithm may be applied which exploits this knowledge in order to compress the data more effectively.

The compressed word output by the data compressor 208 is input to the endurance encoder 210. The endurance encoder 210 uses specific characteristics of the compressed word, and possibly information about the error correction code (ECC) to be used and the previous page contents, in order to select one out of a plurality of endurance codes. In an exemplary embodiment, the non-volatile memory 206 is a 'write-once' memory such as binary NAND flash, and the endurance encoder 210 is a two-level one-shot bounded weight binary coder. That is, the endurance encoder 210 assumes that the write is to an erased page and it produces output words that have less than a fixed number of non-erased symbols. In this case, the endurance encoder 210 selects the bounded weight constraint on the basis of the length of the compressed data word, in order to obtain the maximal endurance gain while ensuring that the endurance coded word will fit into the fixed page-length of the memory 206. Thus, if the original data was very compressible, and the compressed word length is small, a small bounded weight constraint can be obtained to obtain high endurance gain. Alternately, if the page is not very compressible, a large bounded weight constraint may be used to ensure that the endurance coded word will fit into the memory page. Further, the endurance encoder 210 may utilize knowledge of the ECC code rate while selecting the bounded weight to enforce; this may be used, for instance to guarantee that the error-coded word written into memory 206 will satisfy a given weight constraint.

In an alternate embodiment, the non-volatile memory 206 is a 'rewritable' memory such as multi-level phase-change memory, and the endurance encoder 210 uses multi-level waterfall codes. The waterfall code selected by the endurance encoder is a function of the compressibility of the data as indicated by the output of the data compressor 208. The endurance coder can also make use of other codes known in the art, such as those for write-once and write-efficient memories, wherein one of a plurality of codes is selected for endurance coding based on the output of the data compressor 208.

Once the endurance code is selected, the code is used to produce an output codeword corresponding to the compressed word produced by the data compressor 208. In another exemplary embodiment, the memory 206 is a write-once or a rewritable memory (such as PCM) and the endurance encoder 210 additionally uses knowledge of the previous page content of the memory 206 in order to both select the endurance code, as well as to generate the output codeword. This previous content is read by the memory read process 218, and the endurance coder uses the output of the process 218, in order to generate the endurance coded codeword. The index of the endurance code used is input to the RAM code table 204.

As depicted in FIG. 2, the output of the endurance encoder 210, the output of the data compressor 208 and the original write data are input to a data selector 212. The data selector 212 decides which of the three is to be written into the memory 206, on the basis, for example, of the lengths of the words, and of the gains obtained by compression and endurance coding. In an alternative exemplary embodiment, this decision is made by the data compressor 208 and the endurance encoder 210 in sequence and the data selector 212 is not required. For example, if the output of the data compressor 208 is as long or longer than the input word, the data compressor 208 simply outputs the input word to the endurance coder 210. Similarly, if the word produced by the endurance encoder 210 is too long to fit into a page or has other undesirable characteristics, the endurance encoder 210 simply outputs the compressed/original write data word directly to an error correction encoder 214. In both of these embodiments, the coding status of the page is sent to the RAM code table 204 for storage. The output of the data selector 212 is then sent to the error correction encoder 214, which selects one of a plurality of ECCs to encode the data.

Figure 3:
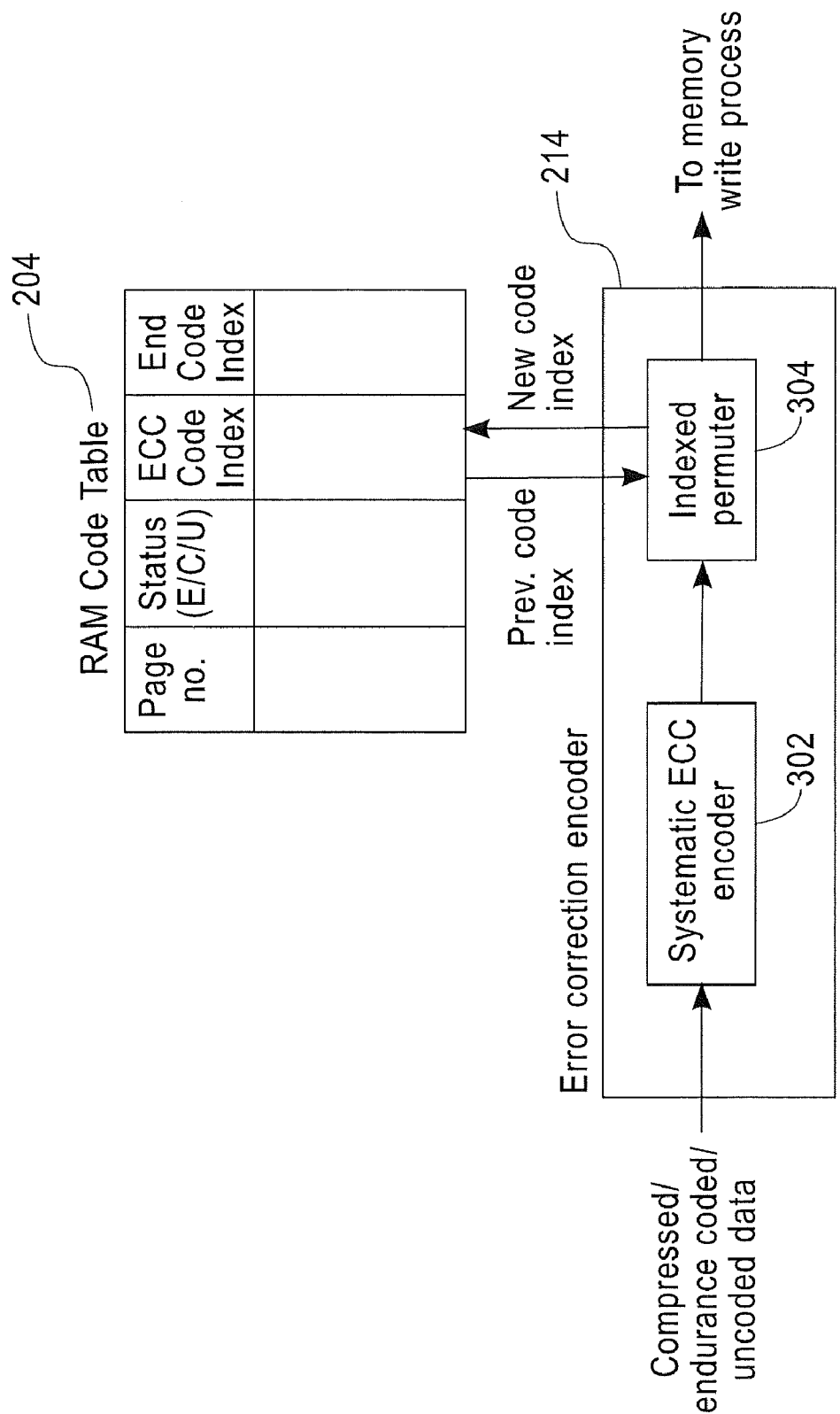
FIG. 3 illustrates a block diagram of an error correction encoder that may be implemented by an exemplary embodiment.

FIG. 3 illustrates a block diagram of an error correction encoder 214 that may be implemented by an exemplary embodiment. As depicted in FIG. 3, the input data is first encoded using a systematic code using a systematic ECC encoder 302. The output of the systematic ECC encoder 302 is then input to an indexed permuter 304 to permute the encoded data using one of a plurality of predetermined permutations. The selected permutation is based on the ECC code index stored in the RAM code table 204. In alternative exemplary embodiments, a plurality of systematic codes may be used such that the input data is contained in the generated codeword and the parity symbol locations vary with a varying code index. The advantage of using either of these exemplary embodiments is that the wear caused by the parity bits is spread across cell locations thereby leveling the wear and improving memory endurance. The index of the ECC code used is sent to the RAM code table 204 for storage, while the codeword is sent to a memory write process for writing to the memory 206 (e.g., a memory device).

In an exemplary embodiment, the rate of the ECC used by the error correction encoder 214 is dependent on the compressibility of the data as indicated by the output of the data compressor 208. In an exemplary embodiment, a minimum (or default) error correction capability (e.g., as measured by the number of ECC parity bits) is always used. When the length of the compressed data is below a pre-defined threshold, the number of ECC parity bits is increased in order to provide a greater error correction capability. Thus, in this embodiment, both the endurance code and the ECC code selection is done on the basis of the compressibility of the data. As described before, the endurance code selection by the endurance encoder 210 is done utilizing knowledge of the ECC code to be used. This ensures that the codeword generated by the encoder 214 is of the correct length to be written in memory. In an alternative embodiment, a plurality of ECC protection levels are possible (including no protection), and the appropriate level is selected based on comparison of the compressed data length with multiple thresholds.

Referring back to FIG. 2, the codeword generated by the error correction encoder 214 is sent to a memory write process 216 for writing to the memory 206. In an exemplary embodiment, the memory 206 is such that the memory write process 216 has one or more programmable parameters which allow it to vary attributes such as the write speed, write power, write wear etc. For example, the memory 206 may be a PCM which uses multiple iterations per cell write, and the number of iterations is programmable; where the larger number of iterations used, the greater is the accuracy of the write process, but power expenditure and write latency are also higher. As another example, the memory 206 may be a flash memory where the placement of the floating-gate voltage levels is programmable. In this case write speed, write power and write wear can be reduced by spacing levels closer together, at the expense of an increase in the probability of error due to floating-gate charge perturbations. In this embodiment, the error correction capability is selected by the error correction encoder 214 on the basis of the compressibility of the data, as indicated by the output of the data compressor 208, and the write process parameters are selected on the basis of the error correction capability employed. Thus, for example, if the data is highly compressible, a high error-correction capability may be employed, which allows selection of write parameters so as to reduce write power, reduce write latency and/or reduce write wear at the expense of write accuracy; the higher error correction capability ensures that the reduced write accuracy suffices for reliable data storage.

The RAM code table 204 depicted in FIG. 2 allows quick access of the information required for the endurance coding to work. To ensure that the information in the RAM code table 204 is not lost (due to a power outage, for instance) the RAM code table 204 is periodically written back to the non-volatile memory 206 (or some other memory). In this process, the information in the RAM code table 204 is ECC coded for protection by the error correction encoder/decoder 222, and then written to the non-volatile memory 206 by the write process 220. In case of power loss, the RAM code table 204 can be reloaded from memory by the read process 220 and the error correction decoder 222. In an alternative exemplary embodiment, the RAM code table 204 acts as a cache for the status information and information for only a subset of non-volatile memory pages is stored in the RAM code table 204 at any given time. As pages are accessed, their information is shifted into the RAM code table 204, and when a page is not used for a given period of time, information is shifted out of the RAM code table 204. Other caching techniques known in the art can be used to shift information in and out of the RAM code table 204 in exemplary embodiments. In another embodiment, the RAM code table 204 (which may or may not be used as a cache) is stored on a second non-volatile memory device, which has higher endurance than the non-volatile memory device on which data is stored.

It should be noted that the selection of the endurance code on the basis of the characteristics of the compressed data word is advantageous, in that it ensures that that the endurance gain can be adapted to the page compression and thus the maximum benefit of endurance coding can be obtained. At the same time, it ensures that the generated data will always fit inside a given memory page without requiring any changes to the memory page length, which considerably simplifies memory bookkeeping, and thus, improves memory access performance.

Figure 4:
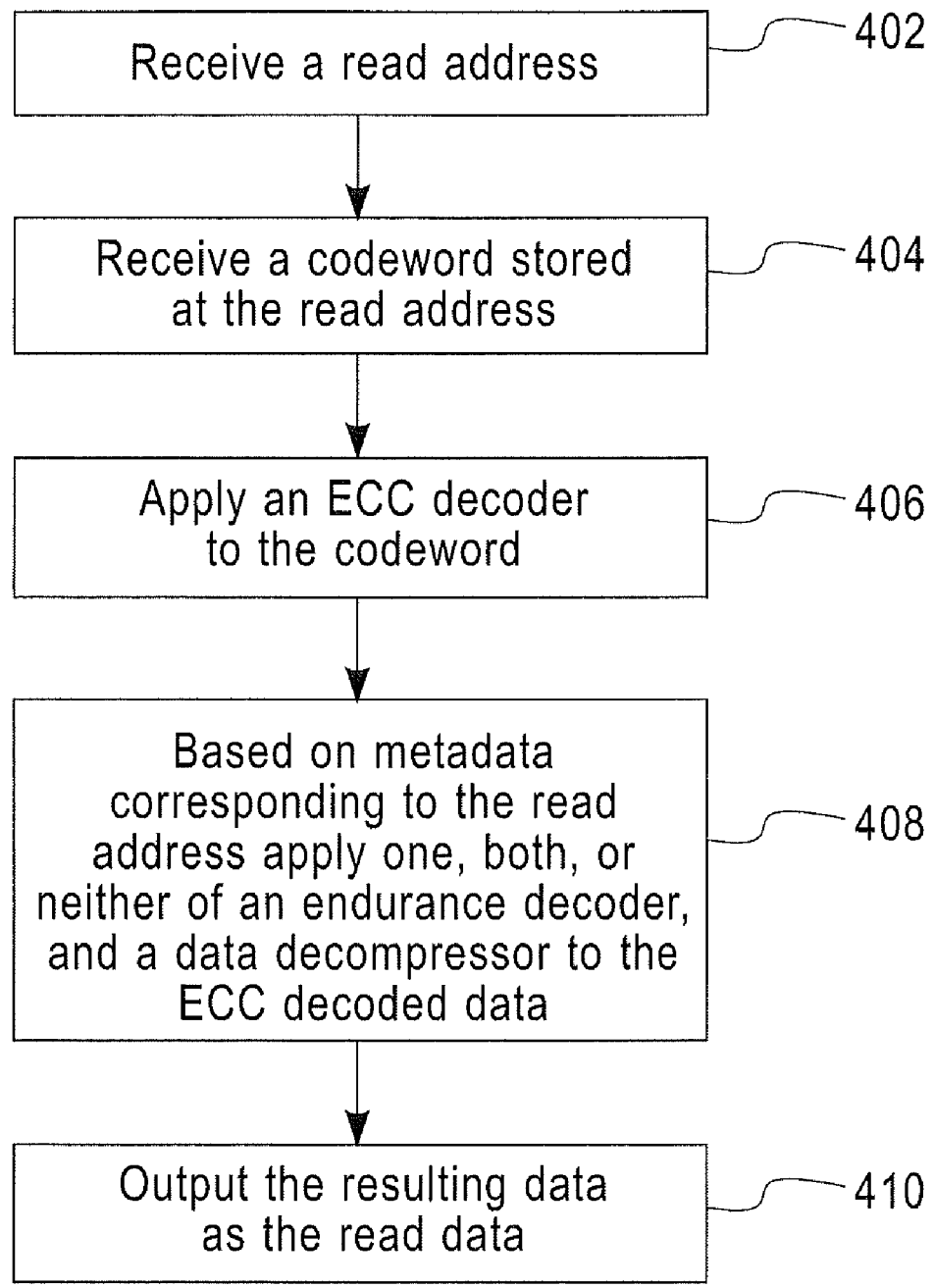
FIG. 4 illustrates a process for reading data that may be implemented by an exemplary embodiment.

FIG. 4 illustrates a process for reading data using adaptive endurance coding that may be implemented by an exemplary embodiment. At block 402, a read address is received (e.g., at a memory controller) and at block 404 a codeword stored at the read address is retrieved from memory 206. An ECC decoder is applied to the codeword at block 406. At block 408, metadata corresponding to the page (or other memory unit) referenced by the read address is retrieved and/or derived. The metadata describes a status of data stored in the memory page. In an exemplary embodiment, the status is un-coded, compressed, or compressed and endurance coded. In addition, the metadata may describe the endurance coding and ECC coding used for data in the memory page. If the page status is un-coded, then the ECC decoded data is output as read data at block 410. If the page status is compressed, then the ECC decoded data is decompressed and output as the read data at block 410. If the page status is compressed and endurance coded, then the ECC decoded data is sent through an endurance code decoder and then decompressed and output as the read data at block 410.

Figure 5:
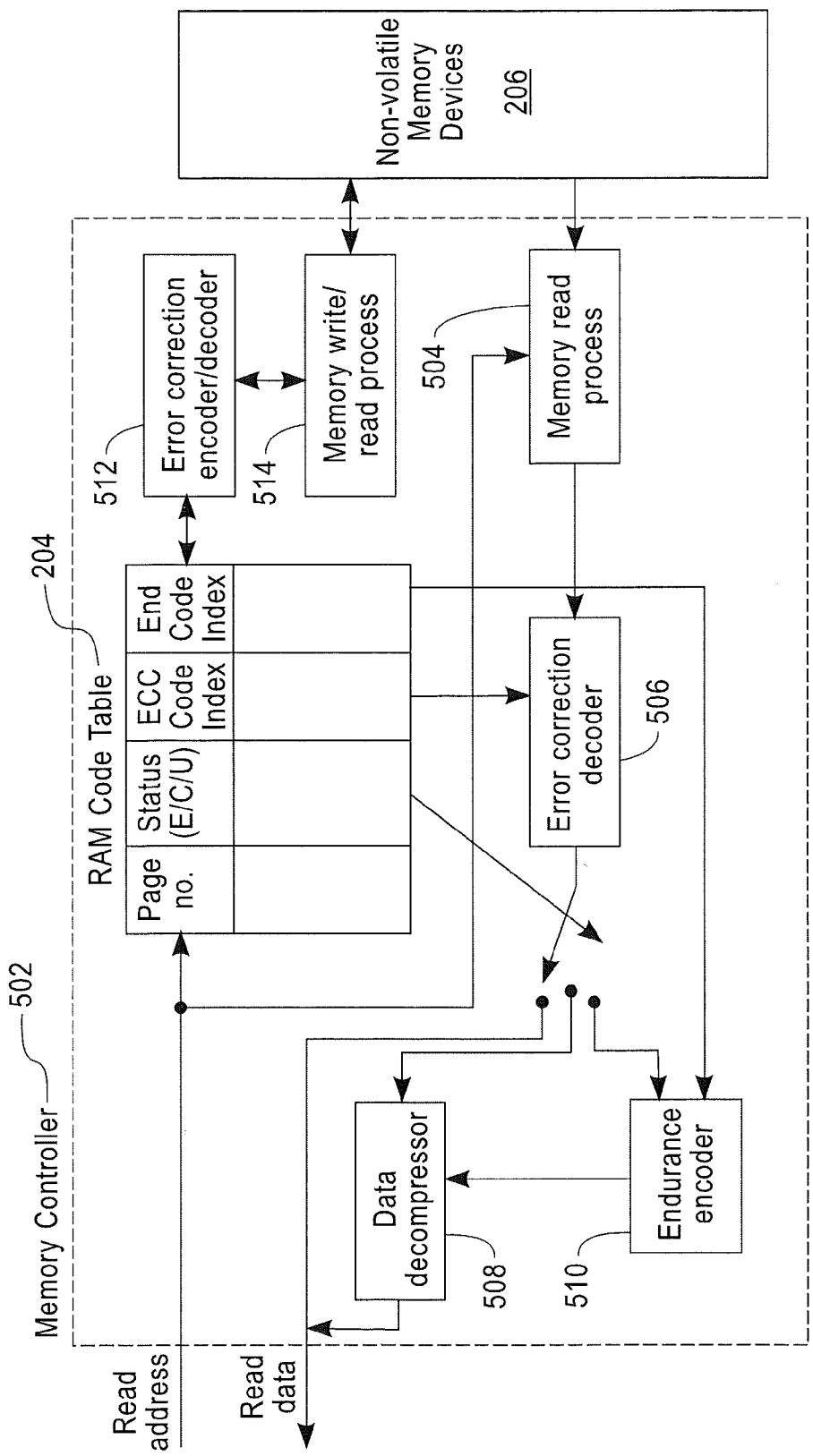
FIG. 5 illustrates a block diagram of a memory controller for reading data that may be implemented by an exemplary embodiment.

FIG. 5 illustrates a block diagram of a memory controller for reading data that may be implemented by an exemplary embodiment. Given the read address, the RAM code table 204 is loaded with the appropriate page status information (e.g., the metadata), if needed. In an exemplary embodiment, this is done by the read process 514 and the error correction decoder 512. The data is then read from the memory 206 by the memory read process 504. The codeword read from the memory 206 is input to the error correction decoder 506 which uses a decoding process corresponding to the ECC code index corresponding to the page address (i.e., the read address) in the RAM code table 204. Depending on the page status (E/C/U), the output of the error correction decoder 506 is appropriately routed. If the status is U (un-coded), the output of the error correction decoder 506 is directly output by the memory controller 502, as the read data. If the page status is C (compressed), the output of the error correction decoder 506 is routed to a data de-compressor 508, and the decompressed output is output by the memory controller 502 as the read data. Finally, if the read status of the page is E (endurance coded), the data is routed to an endurance decoder 510, then to the data de-compressor 508, and then finally output by the memory controller 502 as the read data. In an exemplary embodiment, the outputting is performed by a transmitter located on the memory controller 502 (or in other location). The transmitter may be implemented in a variety of manners including hardware for transmitting the outputs and a storage location or register where the outputs are stored.

It should be noted that all or a portion of the elements illustrated in FIGS. 2 and 5 may be located in another physical location, such as, but not limited to another memory element such as a memory module or memory hub).

Exemplary embodiments described above employ a table, the RAM code table 204, accessible to a memory controller that describes a page status (E/C/U) and other information necessary for the correct interpretation of the information read from a page. This information and any other information that may be employed for this task is referred to herein as "metadata". In some instances it is desirable to implement an embodiment in a manner that does not necessitate the use of this controller table and instead, stores the metadata directly with the data in the memory 206. A reason is that a controller table is sometimes expensive to implement. The main difficulty with a straightforward implementation of this idea is that the physical memory storing the metadata is generally subject to the same wear and error mechanisms that the rest of the data locations are subject to, and therefore the metadata cannot be stored verbatim in a fixed location of the memory 206. In principle, both endurance coding and error correction coding are needed for the metadata as well, creating a circular problem.

A solution to this problem that may be implemented by an exemplary embodiment is described below. Denote the metadata by the vector m, and the codeword to be written into memory by the vector v. Define two pre-specified matrices shared by the read and write processes as H and M, wherein H is the parity-check matrix (also referred to herein as a "parity matrix") of a systematic error-correction code and M (also referred to herein as a "metadata matrix"). The basic idea is to not store the metadata m in any pre-specified location, but rather to compute the codeword v such that the metadata can be recovered by multiplying the matrix M times the vector v. The systematic ECC ensures that v can be correctly recovered from the memory. In an exemplary embodiment, an additional requirement is that the check positions (also termed "additional bits") of the systematic ECC should be rotated as a particular address is written multiple times; this ensures that different memory cells wear evenly.

Figure 6:
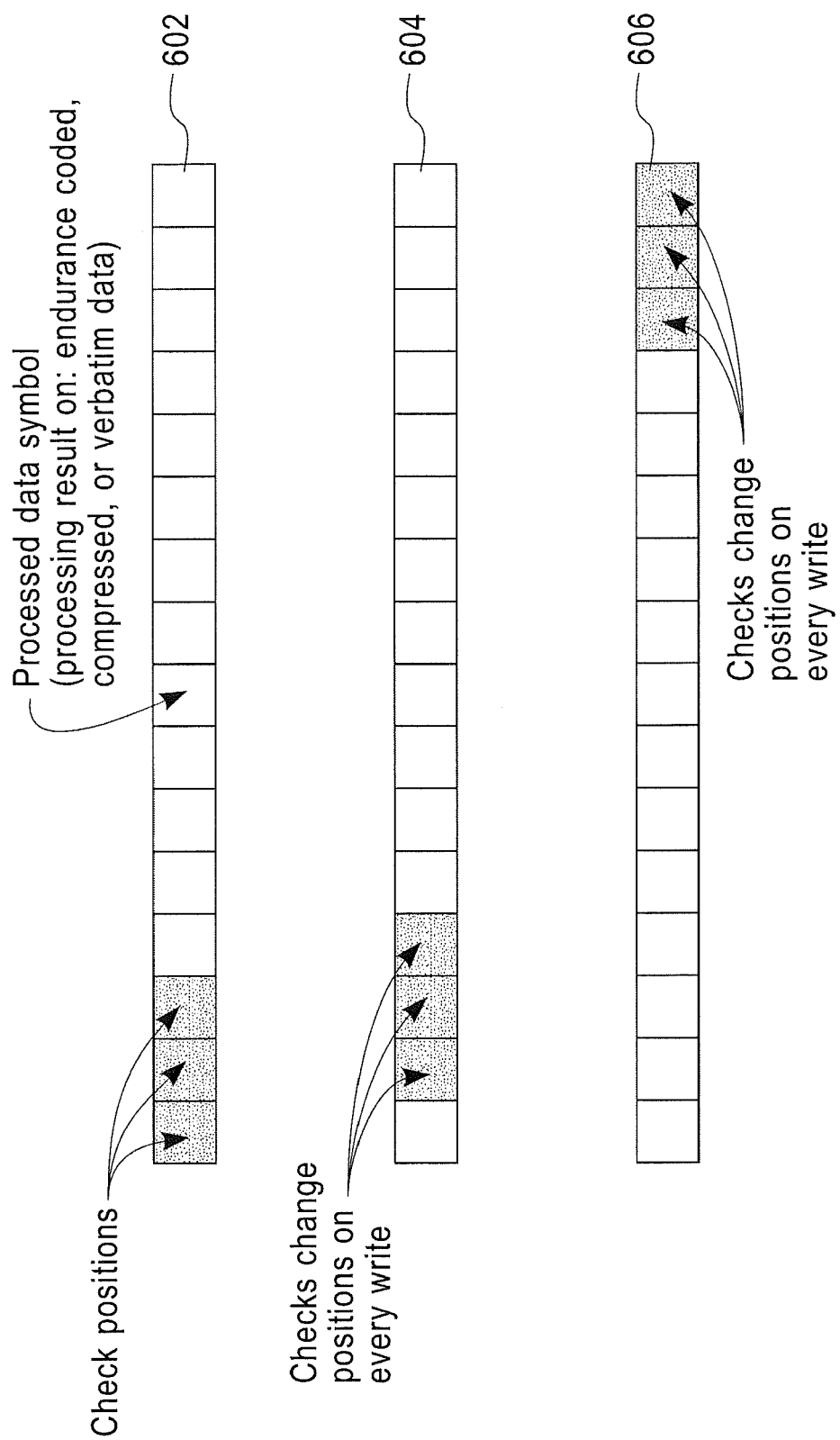
FIG. 6 illustrates an exemplary embodiment that may be implemented to vary the check positions of an ECC from write to write to an address.

FIG. 6 illustrates an exemplary embodiment that may be implemented to vary the check positions of an ECC from write to write to an address (e.g., a page). As depicted in FIG. 6, the ECC bits (or check positions) in a codeword for a first write 602 to an address are located in the first three bits of the codeword. The ECC bits in a codeword for a second write 604 to the address are located in the second through fourth bits of the codeword, and the ECC bits in a codeword for a third write 606 to the address are located in the last three bits of the codeword. Thus, the location of the ECC bits in the codeword is varied.

Figure 7:
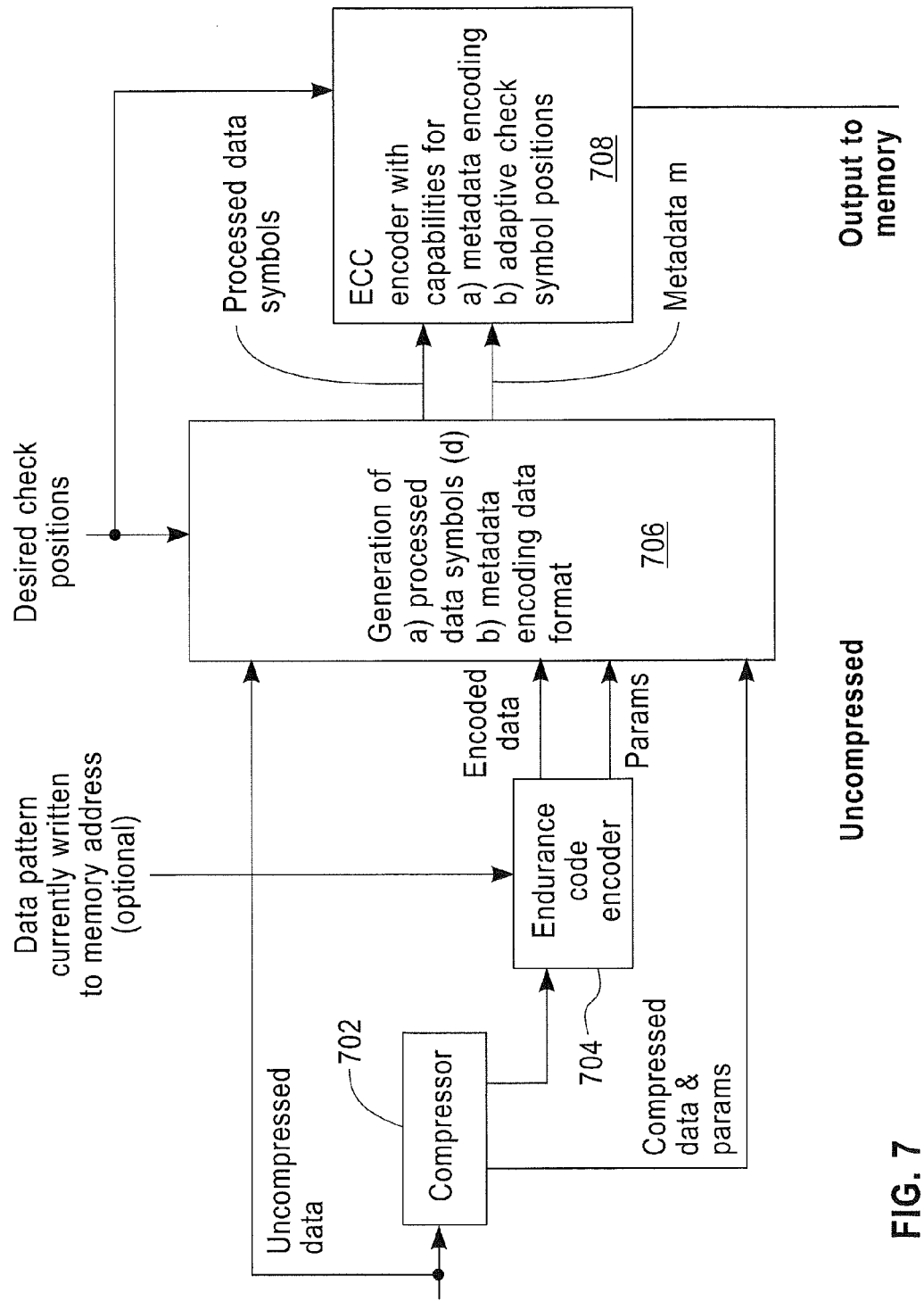
FIG. 7 illustrates a block diagram of a system for writing data that may be implemented by an exemplary embodiment.

FIG. 7 illustrates a block diagram of a system for writing data that may be implemented by an exemplary embodiment, which does not use a code table to store metadata. Uncompressed data is fed to a compressor 702 that produces compressed data, and compression parameters indicating whether the data was compressed or expanded, and to what extent. The compressed data and parameters are passed to an endurance code encoder 704 that selects a way to encode the compressed data using a pattern to be written to memory that is selected so as to result in a smallest cost. This step is optionally dependent on the data currently written in the target memory address. In other words, the cost may depend only on the data pattern that will be written, or it may depend on both the data pattern that will be written and the data pattern that is currently written.

Next, using a data selector 706, it is decided whether the data will be stored uncompressed, compressed, or compressed and endurance coded. Furthermore, metadata is computed that describes this decision as well as the type of endurance coding that was employed, if any. The result of this step is the processed data symbols that will be stored in memory as well as the metadata.

The metadata and the processed data symbols are passed to an ECC encoder 708 that generates check symbols for a given set of positions that are passed externally to the ECC function. The given set of positions for a particular memory address rotate each time the address is written to, as described previously. The generation of the check symbols by the ECC encoder 708 ensures that they are selected so that the resulting codeword v, when multiplied times the matrix M, results in the desired metadata m. The result of the ECC encoding, the codeword v, is output to the memory.

Figure 8:
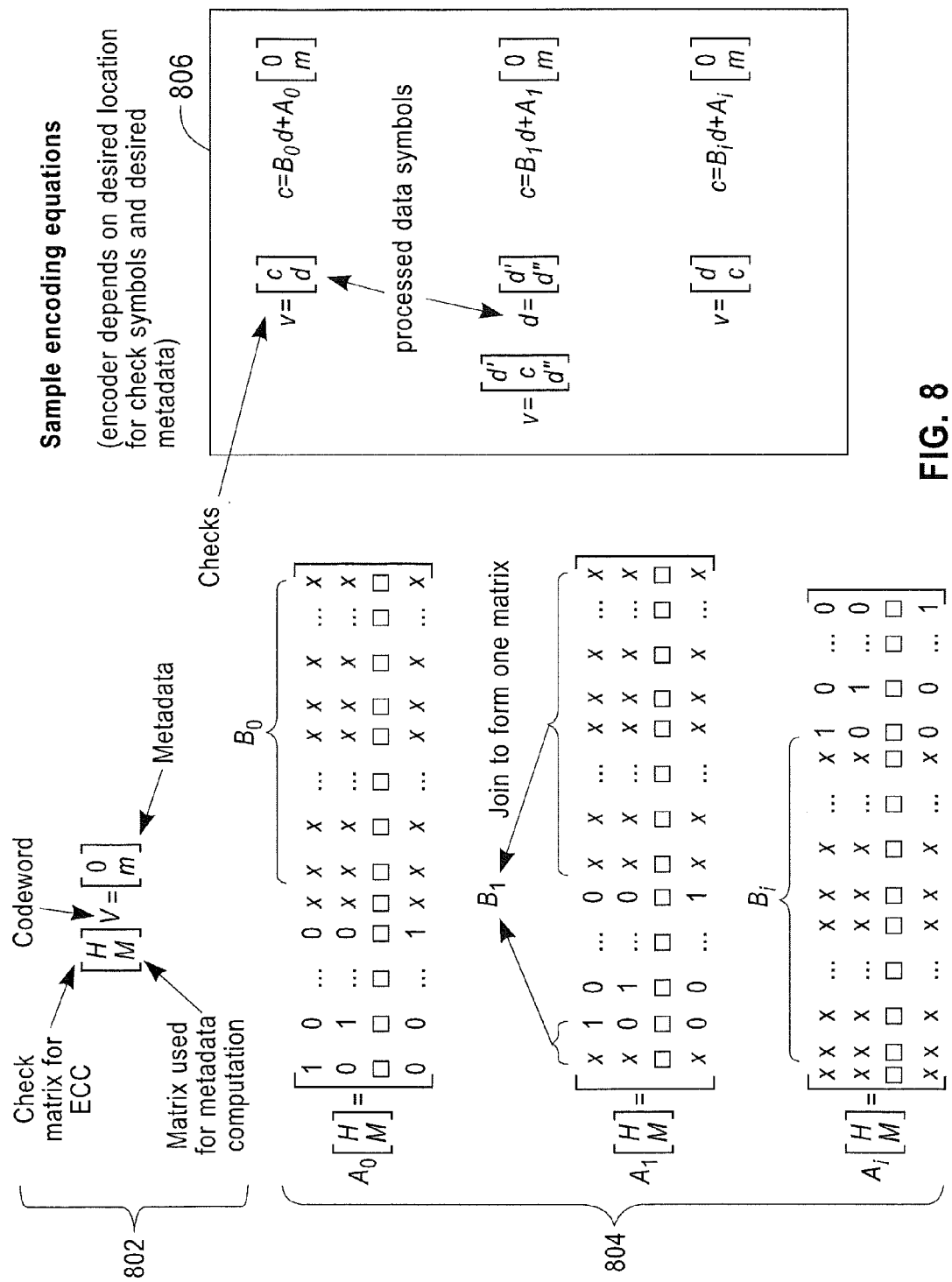
FIG. 8 illustrates an encoder that may be implemented by an exemplary embodiment.

FIG. 8 illustrates an ECC encoder 708 that may be implemented by an exemplary embodiment. The matrices H and M are pre-fixed, and the matrix H is the parity check matrix of a systematic ECC. The first equation 802 defines the general expectation from the ECC encoder 708: it is required to compute a codeword vector v such that $Hv=0$, and hence v is a codeword of the linear code defined by the parity check matrix H, and $Mv=m$, so that metadata m can be recovered from v through the multiplication Mv. The other requirement for the ECC encoder 708 is that the codeword v has check symbols, denoted by the vector c, located in the externally specified symbol positions; it thus has the given processed data symbols, denoted by the vector d, in the remaining positions. In one example, the set of positions is a contiguous set of symbols within the codeword whose starting position may be selectable.

As seen in FIG. 8, the processed data symbols d and the check symbols c are assembled to form the codeword v. The assembly depends on the desired location of the check symbols. Three examples are given in block 806 of FIG. 8: one where the check symbols are at the beginning of the codeword, another starting at the second symbol of a codeword, and a third at the end of the codeword.

Also included in the FIG. 8 above are the equations 804 that the encoder may utilize to compute the check symbols. These equations depend on matrices $B_0, B_1, \ldots, B_i$, the desired metadata m, and the desired processed data symbols d. There is one such matrix for every possible position for the checks.

The matrices $B_0, B_1, \ldots, B_i$ can be found by processing the pre-specified matrices H and M. In an exemplary embodiment, the processing is as follows: find a matrix $A_0$ such that $$A_0 \begin{bmatrix} H \\ M \end{bmatrix} = [\, I \quad B_0 \,],$$

where I denotes the identity matrix. The other section of the result of the pre-multiplication is $B_0$, the desired matrix for when the check symbols will be placed in the beginning of the codeword v. Similar procedures result in $B_1$ (illustrated), $B_2$ (not illustrated), etc. In general, each $B_i$ can be computed by determining a matrix $A_i$ such that when $A_i$ is multiplied by the matrix $$\begin{bmatrix} H \\ M \end{bmatrix},$$

the resultant matrix contains the identity matrix in columns corresponding to the desired data-symbol positions. It is noted that in an actual implementation it is not necessarily required to have circuitry devoted to all $B_0$, $B_1$, $B_2$, etc. For example if H is the parity-check matrix of a cyclic code, then $B_i$ can be computed from $B_0$ by pre-multiplying $B_0$ with a diagonal matrix. The symbols of the error correction code defined by H may come from any Galois Field, including $GF(2^p)$ where p is any desired extension field degree.

Once $A_i$ is computed, the check bits are computed as $$c = B_i d + A_i \begin{bmatrix} 0 \\ m \end{bmatrix},$$

and the codeword v is computed by assembling the vectors c and d in a manner such that the check-bit and data symbols are in the desired positions, as shown by equations 806 in FIG. 8. The codeword v has the property that equation 802 holds, as desired.

Figure 9:
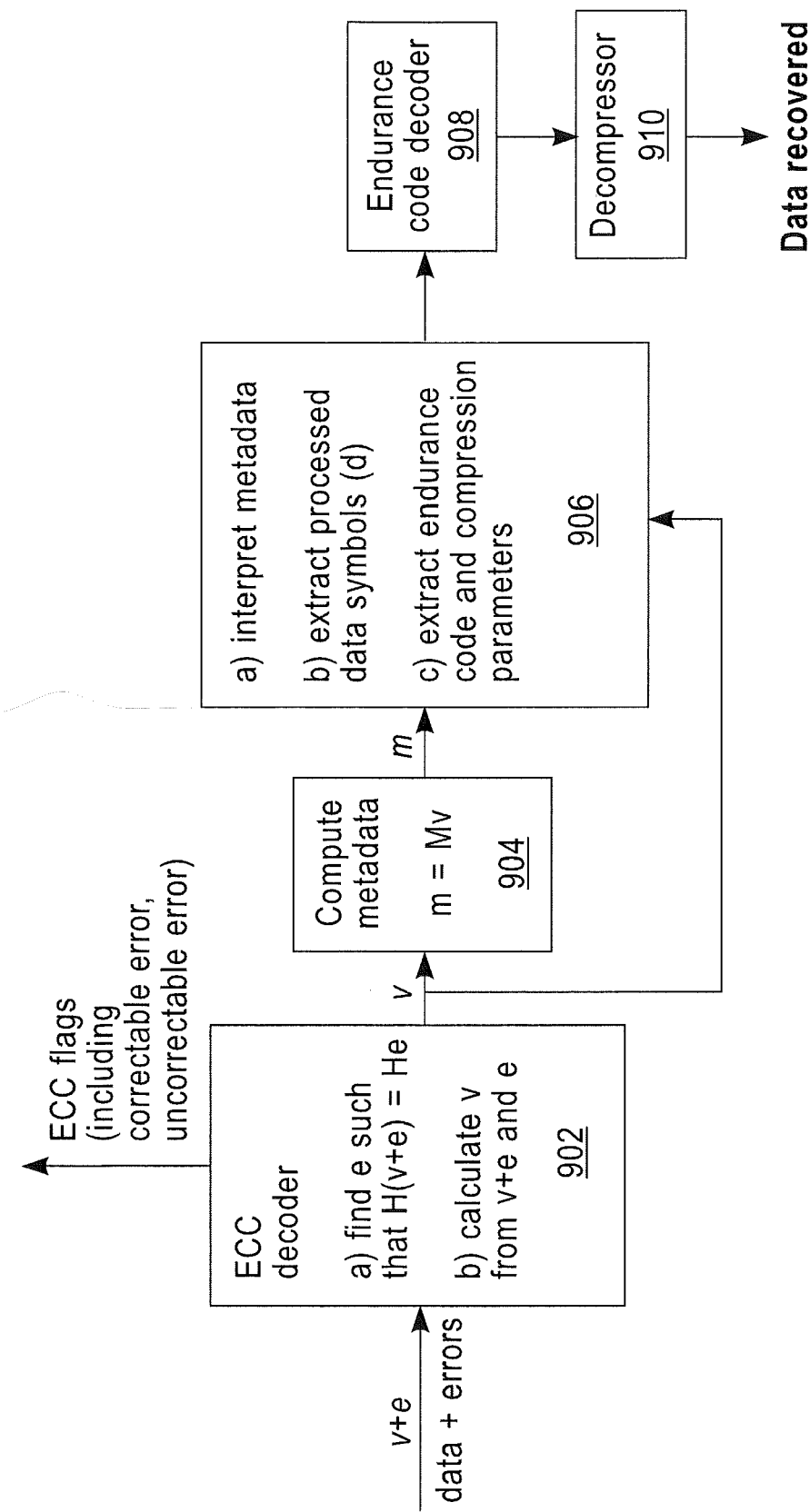
FIG. 9 illustrates a block diagram of a system for reading data that may be implemented by an exemplary embodiment.

FIG. 9 illustrates a block diagram of a system for reading data that may be implemented by an exemplary embodiment. The original codeword written to memory is denoted by the vector v, which, in this example, is corrupted by an error vector e, such that upon reading, the received word is v+e. This is input to an ECC decoder 902. The ECC decoder 902 attempts to find an error pattern e such that H(v+e)=He. If the ECC decoder 902 succeeds (assuming no miscorrection happens), then it finds v by calculating it from v+e and e. The ECC decoder 902 also produces error correction code flags describing an uncorrectable error status, a correctable error status, etc. The result of the decoding, v, is passed to a compute metadata block 904 which computes the metadata vector m=Hv. The result of the metadata computation, m, is passed to a metadata interpreter block 906 that interprets the metadata so as to recover the endurance code and compression parameters, as well as the position of the processed data symbols. In an exemplary embodiment, the endurance code parameters include a description of what endurance code was used to encode the data, if any. In an exemplary embodiment, the compression parameters include a description of whether the data was compressed or not. The processed data symbols are recovered from v along with the information about the location of the processed data symbols. The result is then fed to an endurance code decoder 908, and then to a de-compressor 910, resulting in the desired data.

In an exemplary embodiment of a system for writing to an error-free memory, which does not use a code table to store metadata, inputs to a write encoder include the data to be stored in memory, the desired location of data within the codeword to be written into memory (which may be included in the metadata and is referred to herein as "a data location specification") as well as additional metadata including compression and endurance code parameters. The output of the encoder is a codeword vector consisting of the data and additional symbols, arranged in a manner consistent with the data location specification, i.e. a codeword wherein the data symbols are located at the desired symbol positions. The write encoder finds the codeword that satisfies the location specification, such that when the codeword is multiplied by a pre-specified matrix M, the result is the metadata.

In an exemplary embodiment of a system for reading the data written by the previously described write encoder embodiment, the input to a read decoder includes the codeword received from memory. The output of the read decoder is the data stored in memory and, optionally, the metadata. The read decoder multiplies the matrix M times the received codeword to recover the metadata, and from the metadata recovers the location of data and additional bits within the codeword. It returns (or outputs) the data and, if needed, the metadata.

In an exemplary embodiment of a system for writing to a memory with errors, which does not use a code table to store metadata, the inputs to a write encoder include the data to be stored in memory, the desired location of data within the codeword to be written into memory, as well as additional metadata including compression and endurance code parameters. The output of the encoder is a codeword vector containing the data and additional symbols, arranged in a manner consistent with the location specifications, i.e. a codeword wherein the data symbols are located at the desired symbol positions, wherein the additional bits include parity bits of a pre-specified ECC. The write encoder finds the codeword that satisfies the location specification, such that when the codeword is multiplied by a pre-specified matrix M, the result is the metadata, and such that when the codeword is multiplied by the parity-check matrix H of the ECC, the result is a known value, such as zero.

In an exemplary embodiment of a system for reading the data written by the previous write encoder embodiment, the input to a read decoder includes an erroneous codeword received from memory. The output of the read decoder is the data stored in memory and, optionally, the metadata. The decoder applies the pre-fixed ECC with parity-check matrix H to correct the errors in the received codeword. If the correction is successful, the decoder multiplies the matrix M times the corrected codeword to recover the metadata, and from the metadata recovers the location of data and additional bits within the codeword. The decoder returns (or outputs) the data and, if needed, the metadata.

In an exemplary embodiment of a system for writing to a memory with errors, which does not use a code table to store metadata, the inputs to a write encoder include the data to be stored in memory, the desired location of data within the codeword to be written into memory (which may be included in the metadata), a variable number of ECC symbols (or bits) to use (with the number of ECC symbols chosen from a plurality of possibilities), and additional metadata including compression and endurance code parameters. The output of the encoder is a codeword vector consisting of the data and additional symbols, arranged in a manner consistent with the location specifications, i.e. a codeword wherein the data symbols are located at the desired symbol positions, wherein the additional bits include parity bits from an ECC selected based on the number of required ECC bits. The write encoder finds the codeword that satisfies the locations specification, such that when the codeword is multiplied by a pre-specified matrix M, the result is the metadata, and such that when the codeword is multiplied by the parity-check matrix H of the selected ECC, the result is a known value, such as zero.

In an exemplary embodiment of a system for reading the data written by the previous write encoder embodiment, the input to a read decoder includes an erroneous codeword received from memory. The output of the read decoder is the data stored in memory and, optionally, the metadata. For each possible number of variable ECC bits, the decoder attempts to apply the corresponding parity-check matrix to correct the errors. If there is exactly one parity-check matrix that results in successful correction, the decoder multiplies the matrix M times the corrected codeword to recover the metadata, and from the metadata recovers the location of data and additional bits within the codeword. It returns (or outputs) the data and, if needed, the metadata.

An alternate exemplary embodiment includes a method for obtaining similar results, without the need of adding extended metadata describing the endurance coding and compression techniques applied on the stored contents. In the embodiment depicted in FIG. 10, the particular endurance code used is obtained by analyzing the stored content. The write procedure 1000 is as follows. A data sequence 1002 of N bits is to be written onto K>=N cells. The data is compressed to obtain a compressed sequence 1004 of C information symbols. Two thresholds 1006 and 1008, namely c1 and c2, respectively are fixed with c1<c2<N. If C>c2, then the data is written as is, padding the K-N cells with ones to form a sequence 1010 of K expanded bits, optionally scrambling the sequence. In exemplary embodiments, an optional flag bit 1012 is written when the content is written un-coded. If C<=c1, then a first code, namely code 1, is used to perform endurance coding. In exemplary embodiments, code 1 is a bounded weight code with codeword length K whose number of zeros is between z00 and z01, with z00 and z01 being selected such that the total number of possible bounded weight codewords is greater than or equal to $2^{c1}$. In exemplary embodiments, code 1 is a constant weight code with codeword length K whose number of zeros z0 is such that the total number of possible constant weight codewords is greater or equal than $2^{c1}$. In an exemplary embodiment, if c1<C<=c2, then a second code, namely code 2, is used to perform endurance coding. In exemplary embodiments, code 2 is a bounded weight code with codeword length K whose number of zeros is comprised between z10 and z11, with z10 and z11 such that the total number of possible bounded weight codewords is greater than or equal to $2^{c2}$. In exemplary embodiments, code 2 is a constant weight code with codeword length K whose number of zeros z11 is such that the total number of possible constant weight codewords is greater than or equal to $2^{c2}$.

Figure 10:
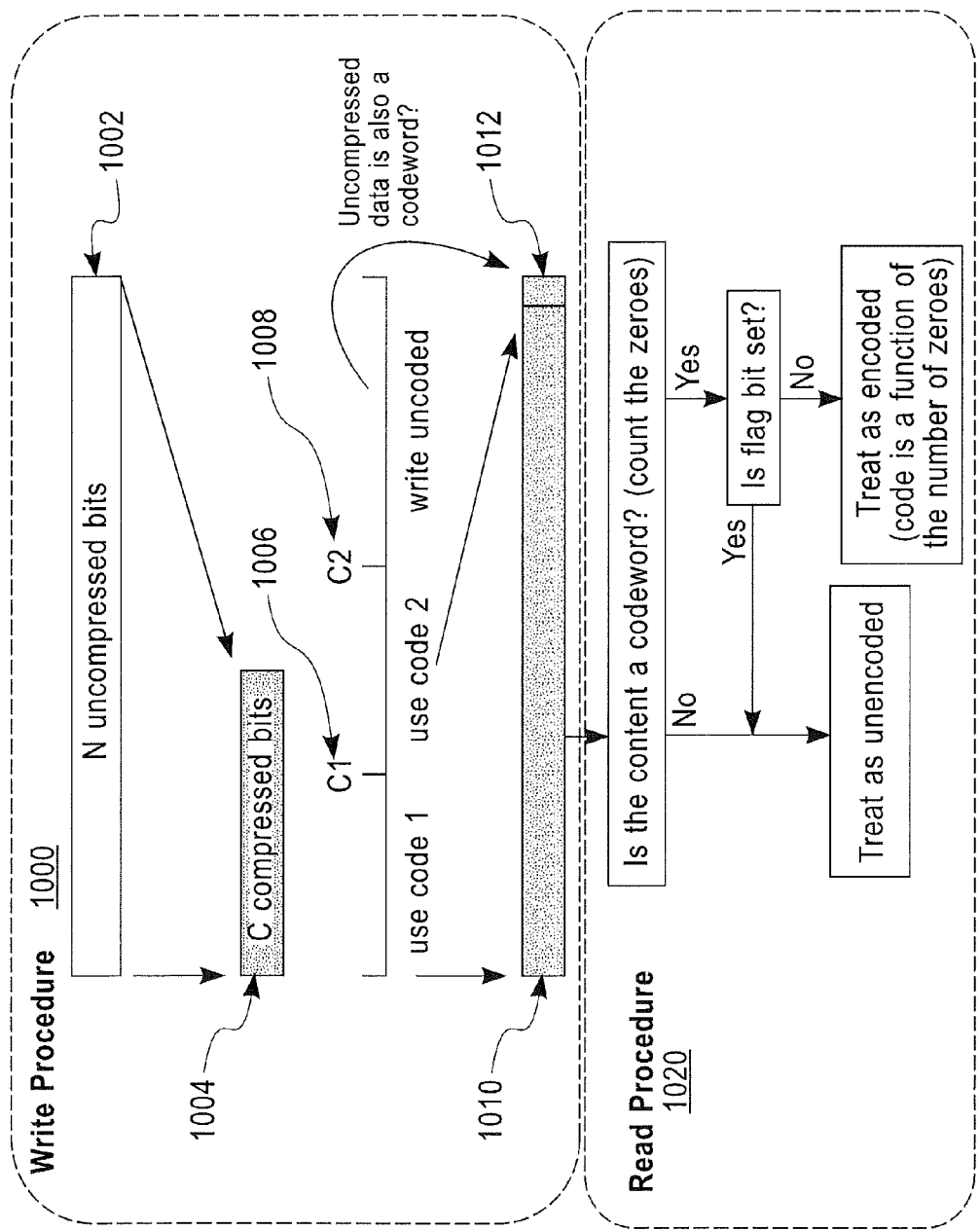
FIG. 10 illustrates a read process that may be implemented by an exemplary embodiment.

In FIG. 10, an exemplary embodiment of a read procedure 1020 is shown. The memory content is read and analyzed in order to identify the endurance code that it belongs to. In exemplary embodiments, the analysis includes counting the number of zeros in the memory content and choosing the unique endurance code that matches the counted number of zeros. If the codeword does not match any endurance code in a possible given family of codes an un-coded content (possibly scrambled) is assumed. In either case, if the additional flag signaling the presence of un-coded content is present and set, an un-coded content is assumed. In case the analysis identifies a code and no un-coded flag is set, then the content is decoded using the identified code. Those skilled in the art will recognize that the present invention is not limited to constant or bounded weight codes and that similar embodiments can use a different number of possible codes chosen among a family of available endurance coding codes for which each code can be uniquely identified by examining a codeword. In an exemplary embodiment, K=N.

Another exemplary embodiment, shown in FIG. 11, includes performing joint compression and expansion according to the following criterion to efficiently encode N data bits into K cells. At block 1102, all data bit sequences are listed and sorted from the highest probability to the smallest probability. At block 1104, all length K codewords are sorted from least costly to most costly, where the cost of a codeword is directly proportional to the impact on endurance associated with writing the codeword. A table representing an injective relation is built from data bit sequences to codewords by associating the first element of the sorted list of data sequences (i.e., the most probable N data bits sequence), with the first element of the sorted list of codewords (i.e., the codeword with minimal impact on endurance), then the second with the second and so on in block 1106. In the corresponding encoding process, the information sequence to be stored is received, the table is consulted to find the corresponding codeword to be written. In the corresponding decoding process, the codeword is retrieved from the memory, and the table is scanned until the codeword is found. The decoded output is the information data that is in relation with the received codeword. In an exemplary embodiment, the general criterion is to associate with the most probable sequences the least costly codewords.

FIG. 12 illustrates an example that may be implemented by an exemplary embodiment. As depicted in FIG. 12, a,b,c,d are the data messages (could be N=2 and a=00, b=01, c=10, and d=11) shown in the same row as their respective probability. Assuming that writing a "0" has a cost equal to one and writing a "1" has a cost equal to zero, two codes are built, with K=2 and K=3, respectively. The messages are ordered by decreasing probability and the corresponding codewords are ordered by increasing cost (0, 1, 1, 2 for K=2 and 0, 1, 1, 1 for K=3). The average cost for the code K=2 is 0.3125 (per cell) and for K=3 is 0.1667 (per cell). Directly writing the mapping a=00, b=01, c=10, and d=11 has an associated cost of 0.6785 (per cell).

Exemplary embodiments described herein apply not only to information encoded in the page of a nonvolatile memory device, but also information encoded in pages of multiple nonvolatile memory devices that work as a single logical entity that delivers data as a result of a single external request. Regardless of whether it is one device or multiple devices that deliver data, the data may come from accessing only a page subsection. In the case of multiple devices, each of the devices access a common page subsection with a common page address Technical effects and benefits include the ability to perform adaptive endurance coding. As described herein, data to be written to memory is converted into a form which causes reduced wear to the memory cells and thus prolongs memory life. In addition, data written as described herein may be more resilient to errors (e.g., data can be recovered even in the presence of errors in the stored information).

The terminology used herein is for the purpose of describing particular embodiments only and is not intended to be limiting of the invention. As sued herein, the singular forms "a", "an" and "the" are intended to include the plural forms as well, unless the context clearly dictates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to includes any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted, or modified. All of these variations are considered a part of the claimed invention.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for storing data comprising:
receiving write data and a write address;
applying a compression algorithm to the write data to generate compressed data;
applying an endurance code to the compressed data, the endurance code selected and applied in response to the amount of space saved by applying the compression to the write data, the applying an endurance code resulting in a codeword; and
writing the codeword to the write address.

2. The method of claim 1, further comprising adding error code correction (ECC) bits to the codeword before writing the codeword.

3. The method of claim 2, wherein the number of ECC bits added to the codeword is responsive to the amount of space saved by applying the compression to the write data.

4. The method of claim 2, wherein the number of ECC bits added to the codeword include a default number of ECC bits and a variable number of ECC bits responsive to the amount of space saved by applying the compression to the write data.

5. The method of claim 2, wherein the location of the ECC bits in the codeword varies.

6. The method of claim 2, wherein the writing is programmed such that at least one of a writing speed is increased, a power level is decreased, and a wear level is decreased when writing the codeword to the write address, the programming responsive to the number of ECC bits added to the codeword.

7. The method of claim 1, further comprising generating metadata for the write address, the metadata utilized by a read operation to decode the codeword written to the write address.

8. The method of claim 7, further comprising storing the metadata in a table.

9. The method of claim 1, further comprising:
reading the codeword;
performing an analysis of the codeword;
identifying the endurance code in response to the analysis;
decoding the codeword using a decoder for the identified endurance code; and
decompressing the decoded codeword to generate the write data.

10. The method of claim 1, wherein applying the compression and applying the endurance coding are performed jointly using a single encoding function.

11. A system comprising:
a receiver receiving write data and a write address;
a data compressor applying a compression algorithm to the write data to generate compressed data;
an endurance coder applying an endurance code to the compressed data, the endurance code selected and applied in response to the amount of space saved by applying the compression to the write data, the applying an endurance code resulting in a codeword; and
a memory writer writing the codeword to the write address.

12. The system of claim 11, further comprising an error correction encoder adding error code correction (ECC) bits to the codeword before the codeword is written by the memory writer.

13. The system of claim 12 wherein the location of the ECC bits in the codeword varies.

* * * * *